United States Patent
Bhatia et al.

(10) Patent No.: US 10,572,342 B2
(45) Date of Patent: Feb. 25, 2020

(54) MEMORY SYSTEM WITH LDPC DECODER AND OPERATING METHOD THEREOF

(71) Applicant: SK hynix Inc., Gyeonggi-do OT (KR)

(72) Inventors: Aman Bhatia, San Jose, CA (US);
Naveen Kumar, San Jose, CA (US);
Chenrong Xiong, San Jose, CA (US);
Fan Zhang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 103 days.

(21) Appl. No.: 15/788,524

(22) Filed: Oct. 19, 2017

(65) Prior Publication Data
US 2018/0113760 A1     Apr. 26, 2018

Related U.S. Application Data

(60) Provisional application No. 62/412,056, filed on Oct. 24, 2016.

(51) Int. Cl.
*G06F 11/10* (2006.01)
*G11C 29/52* (2006.01)
*H03M 13/11* (2006.01)

(52) U.S. Cl.
CPC .......... *G06F 11/1068* (2013.01); *G11C 29/52* (2013.01); *H03M 13/1128* (2013.01)

(58) Field of Classification Search
CPC ............. G06F 11/1012; G06F 11/1068; G11C 11/5642; G11C 16/0483; G11C 29/024; G11C 29/42; G11C 29/52; G11C 29/028; H03M 13/1128; H03M 13/108
See application file for complete search history.

(56) References Cited

U.S. PATENT DOCUMENTS

| | | | |
|---|---|---|---|
| 8,943,381 B1 | 1/2015 | Varnica et al. | |
| 2007/0165581 A1* | 7/2007 | Mehta | H04B 7/026 370/338 |
| 2007/0180345 A1* | 8/2007 | Ismail | H03M 13/1148 714/752 |
| 2009/0034622 A1* | 2/2009 | Huchet | H04N 19/176 375/240.16 |
| 2011/0149835 A1* | 6/2011 | Shimada | H04B 7/024 370/315 |
| 2014/0214734 A1* | 7/2014 | Ozonat | G06N 20/00 706/12 |
| 2014/0257804 A1* | 9/2014 | Li | G10L 15/16 704/232 |
| 2014/0278390 A1* | 9/2014 | Kingsbury | G10L 15/1822 704/232 |
| 2016/0197624 A1 | 7/2016 | Wang et al. | |
| 2016/0335536 A1* | 11/2016 | Yamazaki | G06N 3/0454 |
| 2019/0205733 A1* | 7/2019 | Ghaeini | G06K 9/6267 |

* cited by examiner

*Primary Examiner* — Guy J Lamarre
(74) *Attorney, Agent, or Firm* — IP & T Group LLP

(57) ABSTRACT

An apparatus of a semiconductor memory system and an operating method thereof include: a plurality of memory devices; and a controller coupled with the memory devices, the controller including a training data storage, a classifier trainer, and a decoder, is configured to perform decoding iterations, wherein the training data storage configured to collect and store at least training data, the classifier trainer configured to train classifiers at least with the training data, and the decoder configured to decode code-bits in accordance with rules of the classifier.

17 Claims, 6 Drawing Sheets

MEMORY SYSTEM WITH LDPC DECODER AND OPERATING METHOD THEREOF

CROSS REFERENCE TO OTHER APPLICATIONS

This application claims priority to U.S. Provisional Patent Application No. 62/412,056 entitled "METHOD TO IMPROVE LDPC BIT-FLIPPING DECODER", filed Oct. 24, 2016, which is incorporated herein by reference for all purposes.

BACKGROUND

Field of Invention

Exemplary embodiments of the present disclosure relate to an apparatus of semiconductor memory storage system, and more particularly to LDPC decoder and an operating method thereof.

Description of Related Arts

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD can include flash memory components and a SSD controller. The SSD controller can be also referred as a processor, which includes the electronics that bridge the flash memory components to the SSD input/output (I/O) interfaces. The SSD controller can include an embedded processor that can execute functional components, such as firmware. The SSD functional components are device specific, and in most cases, can be updated.

The two main types of flash memory components are named after the NAND and NOR logic gates. The individual flash memory cells exhibit internal characteristics similar to those of the corresponding gates. The NAND-type flash memory may be written and read in blocks (or pages) which are generally much smaller than the entire device. The NOR-type flash allows a single machine word (byte) to be written to an erased location or read independently. The NAND-type operates primarily in memory cards, USB flash drives, solid-state drives, and similar products, for general storage and transfer of data.

NAND flash-based storage devices have been widely adopted because of their faster read/write performance, lower power consumption, and shock proof features. One drawback is their relatively higher price as compared to hard disk drives (HDD). In order to bring costs down, NAND flash manufacturers have been pushing the limits of their fabrication processes towards 20 nm and lower, which often leads to a shorter usable lifespan and a decrease in data reliability. As such, a much more powerful error correction code (ECC) is required over traditional BCH codes to overcome the associated noises and the interferences, and therefore improve the data integrity. One such ECC is low-density parity-check (LDPC) code. Various algorithms can be utilized for decoding LDPC codes more accurate and faster.

Thus, there remains a need for a semiconductor memory system and operating method thereof for a LDPC decoder. In view of the ever-increasing need to improve performance and security, it is more and more critical that answers be found to these problems. Solutions to these problems have been long sought but prior developments have not taught or suggested any solutions and, thus, solutions to these problems have long eluded those skilled in the art.

SUMMARY

Embodiments of the present disclosure are directed to a semiconductor memory system and an operating method thereof capable of improving the performance and reliability of a memory system.

In accordance with an embodiment of the present disclosure, there is provided with an apparatus of a semiconductor memory system which includes: a plurality of memory devices; and a controller coupled with the memory devices, the controller including a training data storage, a classifier trainer, and a decoder, is configured to perform decoding iterations, wherein the training data storage configured to collect and store at least training data, the classifier trainer configured to train classifiers at least with the training data, and the decoder configured to decode code-bits in accordance with rules of the classifier.

In accordance with an embodiment of the present disclosure, there is provided with a method of operating a semiconductor memory system which includes: performing decoding iterations, wherein the decoding iterations including collecting and storing at least training data, training classifiers at least with the training data, and decoding code-bits in accordance with rules of the classifier.

In accordance with an embodiment of the present disclosure, there is provided with a semiconductor memory system which includes: a processor; and a tangible computer readable storage medium coupled to the processor, embedding non-transitory computer program product executed by the processor, including computer instructions configured to perform decoding iterations, wherein the decoding iterations includes to collect and store at least training data, train classifiers at least with the training data, and decode code-bits in accordance with rules of the classifier.

DETAILED DESCRIPTION

Figure 1:
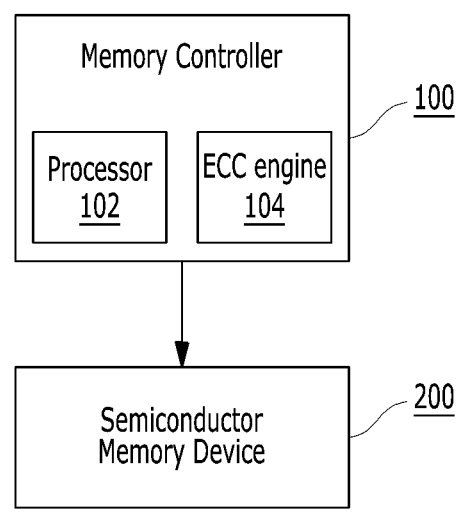
FIG. 1 is a top-level block diagram schematically illustrating a semiconductor memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

LDPC codes are used extensively for providing data reliability in data storage and transmission applications. Belief propagation (BP) and related decoders can represent beliefs for each code-bit as soft-information internally, and provide the maximum error-correction capability. However, due to higher complexity of the decoders, less powerful decoders like bit-flipping (BF) decoders can be used when the number of errors is low. The use of the BF decoders can reduce the frequency for triggering the more powerful but more power-consuming BP decoders.

The BF decoders store only the current value of each code-bit instead of storing the soft-information. The value of each code-bit may be flipped iteratively based on the information of the number of unsatisfied check-nodes for each code-bit. The different rules may be defined to decide whether code-bit values are flipped or not. Currently, the BF rules are optimized heuristically manually to reduce the failure rate of the LDPC decoder. In this work, a framework is proposed to automatically optimize the BF rules for any given LDPC code and transmission channel based on simulation data.

The proposed framework can determine the good BF rules for any given LDPC code. The framework may consist of training a random-forest classifier on genie information of correct/incorrect code-bits as well as features that can be observed by the decoder. When used as the BF rule, the prediction of the classifier may result in better decoding performance than the best rules manually determined.

Two variations of the framework can be utilized. The first framework is called batch-training, in which training data is collected for maximum decoding iterations while using some manually determined BF rules and a single classifier is trained for the collected training data. The second variation of the framework is called sequential training, in which multiple classifiers are trained and the last trained classifier can be used to generate training data for a next classifier. Such that, to train the $i^{th}$ classifier, training data can be collected for i iterations where flipping of code-bits can be done using the rules determined by the $(i-1)^{th}$ classifier.

A BF decoder for LDPC codes can store the current value of each code-bit, which can be initialized based on the hard decision of the channel output. The BF decoder then can iteratively determine which check-nodes are not satisfied by the current values of code-bits and flips some of these values based on the information of unsatisfied check-nodes. The BF decoder may also use other information, such as the current iteration number, the degree of the variable node, the total number of unsatisfied check-nodes, and the number of code-bits whose values flipped in the previous iteration. All the information used by the BF decoder to make a decision can be categorized as features. Table 1 shows some examples of the features and values thereof.

TABLE 1

Examples of features and their values along with the genie-data

| Example # | Iteration number (F1) | Num. of neighboring unsatisfied check nodes (F2) | Degree of variable node (F3) | Total number of unsatisfied check-nodes (F4) | Current value matches channel output (F5) | Genie-Data (whether code-bit should be flipped) |
|---|---|---|---|---|---|---|
| 1 | 0 | 5 | 5 | 380 | True | True |
| 2 | 0 | 1 | 5 | 380 | False | False |
| 3 | 0 | 2 | 3 | 380 | True | True |
| 4 | 0 | 2 | 5 | 380 | True | False |
| 5 | 1 | 4 | 5 | 195 | True | True |
| 6 | 1 | 0 | 3 | 195 | False | False |
| 7 | 2 | 2 | 5 | 195 | True | False |
| 8 | 3 | 2 | 5 | 50 | True | True |
| 9 | 3 | 3 | 5 | 50 | True | False |
| 10 | 8 | 0 | 3 | 4 | False | True |
| 11 | 8 | 0 | 3 | 4 | True | False |
| 12 | 10 | 3 | 5 | 10 | True | True |
| 13 | 1 | 4 | 5 | 320 | True | False |
| 14 | 1 | 4 | 5 | 150 | True | True |
| 15 | 1 | 4 | 5 | 100 | True | False |

Functions mapping the features of a code-bit to True/False decision on whether the code-bit should be flipped can be called BF-rules. Table 2 shows an example of the BF-rules.

TABLE 2

Example of BF-rule based on features in Table 1

| | Code-bit Flipped? |
|---|---|
| F1 equals 0 and F2 equals F3 | True |
| F1 greater than 0 and F2 greater than F3-1 | True |
| F1 greater than 4 and F2 greater than 3 and F5 equals False | True |
| F1 greater than 9 and F4 less than 10 and F2 greater than 2 | True |
| Otherwise | False |

Referring now to FIG. 1, therein is shown a top-level block diagram schematically illustrating a memory system in accordance with an embodiment of the present invention. The memory system can include numerous components including a memory controller 100, and semiconductor memory devices 200, such as flash memory devices. The memory controller 100 can comprise a processor 102 for executing programs and instructions stored in the memory system for operating the memory system.

The memory controller 100 may control overall operations of the semiconductor memory devices 200, via a communication input/output (I/O) bus 104 comprises command CMD, address ADDR, data DATA, power PWR, and a control signal CTRL. The control signal CTRL may include a command latch enable (CLE) signal, an address latch enable (ALE) signal, a chip enable (CE) signal, a write enable (WE) signal, a read enable (RE) signal, and so on.

The semiconductor memory devices 200 may perform one or more erase, program, write, and read operations under the control of the memory controller 100. The semiconductor memory devices 200 may receive the command, address, and data through input/output lines from the memory controller 100. The semiconductor memory devices 200 may receive the power PWR through a power line and the control signal CTRL through a control line.

The memory controller 100 and the semiconductor memory devices 200 may be integrated in a single semiconductor device such as the SSD or a memory card. For example, the memory controller 100 and the semiconductor memory devices 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
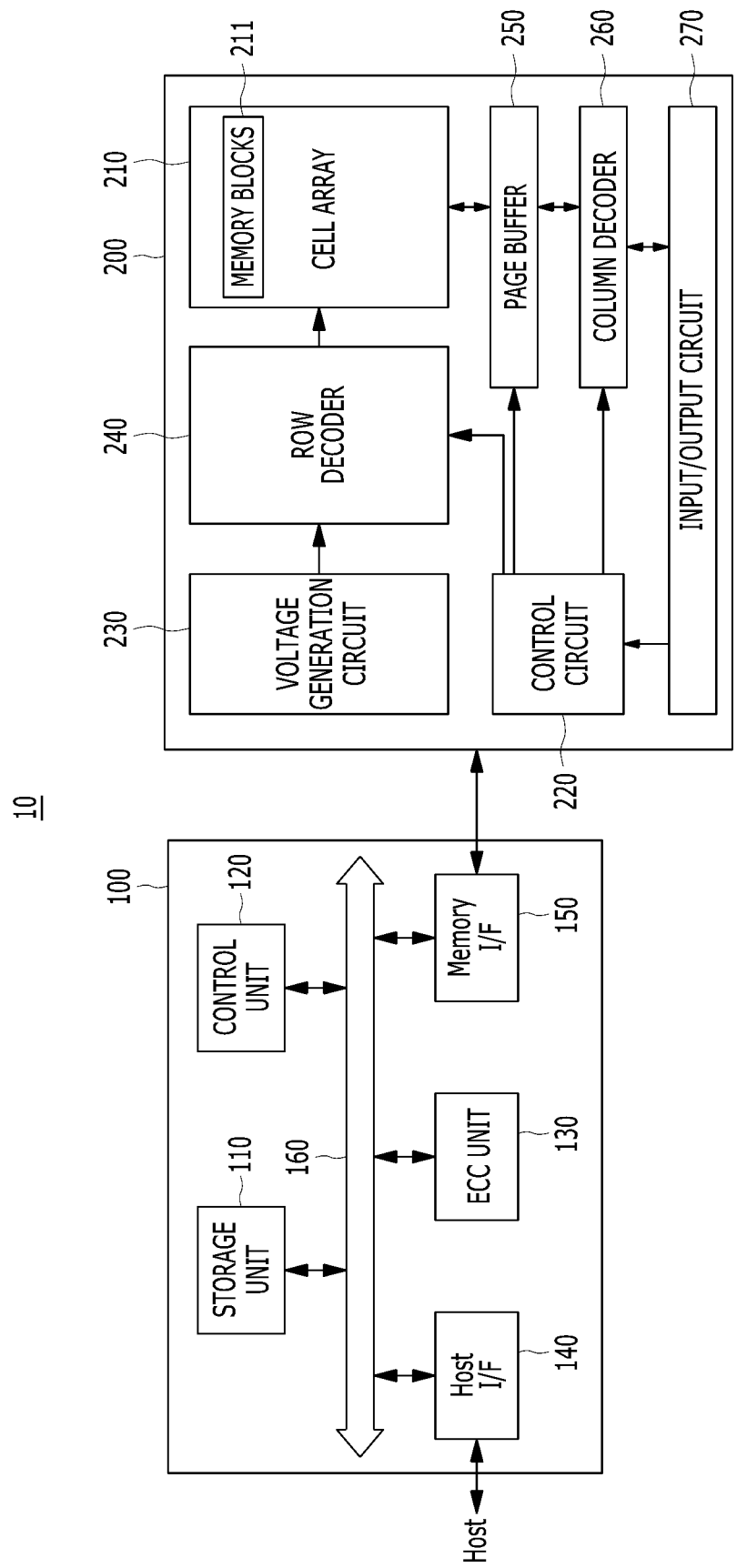
FIG. 2 is a detailed block diagram illustrating a semiconductor memory system in accordance with an embodiment of the present invention.

Referring now to FIG. 2, therein is shown a detailed block diagram illustrating a memory system in accordance with an embodiment of the present invention. For example, the memory system of FIG. 2 may depict the memory system shown in FIG. 1. The memory system may include the memory controller 100 and the semiconductor memory devices 200. The memory system may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The semiconductor memory devices 200 may store data to be accessed by the host device, and can be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory controller 100 may control storage of data in the semiconductor memory devices 200. For example, the memory controller 100 may control the semiconductor memory devices 200 in response to a request from the host device. The memory controller 100 may provide the data read from the semiconductor memory devices 200, to the host device, and store the data provided from the host device into the semiconductor memory devices 200.

The memory controller 100 may include a storage unit 110, a control unit 120, the error correction code (ECC) unit 130, a host interface 140 and a memory interface 150, which are coupled through a bus 160.

The storage unit 110 may serve as a working memory of the memory system and the memory controller 100, and store data for driving the memory system and the memory controller 100. When the memory controller 100 controls operations of the semiconductor memory devices 200, the storage unit 110 may store data used by the memory controller 100 and the semiconductor memory devices 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the semiconductor memory devices 200 for the read and write operations. To store the data, the storage unit 110 may include a program memory, a data memory, a write buffer, a read buffer, a map buffer, and so forth.

The control unit 120 may control general operations of the memory system, and a write operation or a read operation for the semiconductor memory devices 200, in response to a write request or a read request from the host device. The control unit 120 may drive firmware, which is referred to as a flash translation layer (FTL), to control the general operations of the memory system. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the semiconductor memory devices 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low-density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the memory controller 100 and the semiconductor memory devices 200 to allow the memory controller 100 to control the semiconductor memory devices 200 in response to a request from the host device. The memory interface 150 may generate control signals for the semiconductor memory devices 200 and process data under the control of the CPU 120. When the semiconductor memory devices 200 is a flash memory such as a NAND flash memory, the memory interface 150 may generate control signals for the memory and process data under the control of the CPU 120.

The semiconductor memory devices 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may pre-charge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
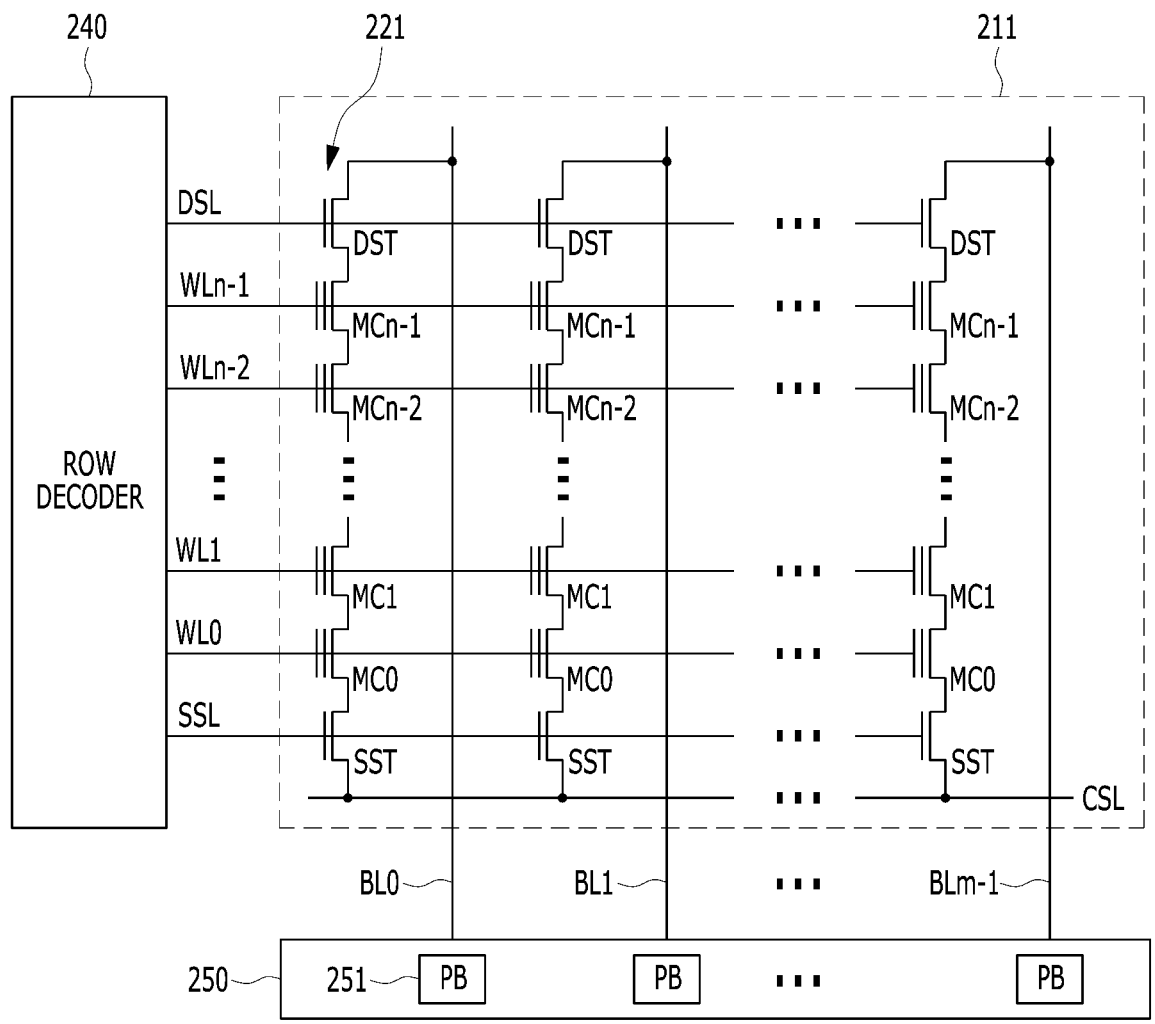
FIG. 3 is a circuit diagram illustrating a memory block of semiconductor memory devices in accordance with an embodiment of the present invention.

Referring now to FIG. 3, herein is shown a circuit diagram illustrating a memory block of semiconductor memory devices 200 in accordance with an embodiment of the present invention. For example, a memory block of FIG. 3 may be the memory blocks 211 of the memory cell array of the semiconductor memory devices 200 shown in FIG. 2.

The memory blocks 211 may include a plurality of cell strings 221 coupled to bit lines BL0 to BLm−1, respectively. The cell string of each column may include one or more drain selection transistors (DST) and one or more source selection transistors (SST). A plurality of memory cells or memory cell transistors may be serially coupled between the DSTs and SSTs. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 4:
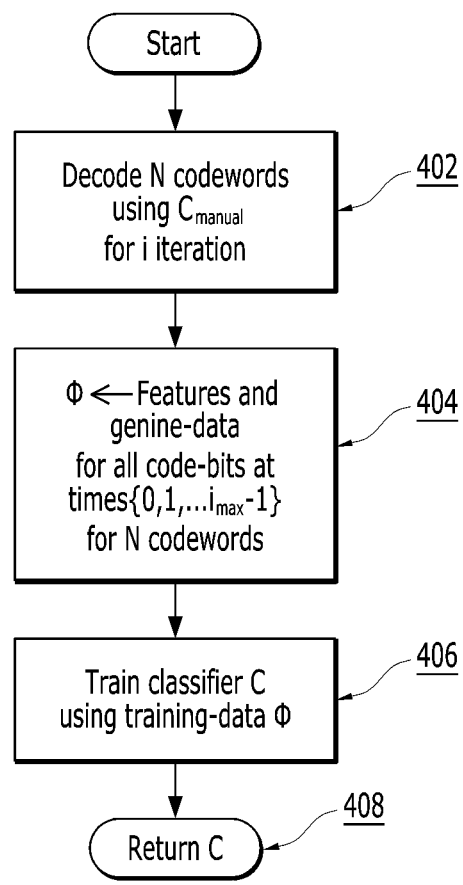
FIG. 4 is a block diagram illustrating shown a flowchart illustrating a BF decoder using batch-training of semiconductor memory devices 200 in accordance with an embodiment of the present invention.

Referring now to FIG. 4, herein is shown a flowchart illustrating a BF decoder using batch-training of semiconductor memory devices 200 in accordance with an embodiment of the present invention. The BF decoder can be defined by the BF-rules used to determine which code-bits to flip at each decoding-iteration. The BF-rules generally can be selected manually by verifying whether the BF-rules have good decoding performance.

The embodiment of the present invention provides the framework which can determine the BF-rules offline by looking at samples of the features along with the genie-data. The training data can be generated by decoding a number of noisy codewords and storing the features and genie data at each decoding iteration. The classifier, such as a random forest classifier, can be trained on the training data. After fitting the random forest classifier that performs well on the training data, the classification of the random forest classifier can be used as the BF-rules in the future. Such that, whether the code-bits are correct or incorrect can be predicted with high accuracy by looking at the another set of features for the code-bits of another noisy word received from the channel.

For example, in the batch-training framework, the manually defined BF-rules can be used for decoding noisy codewords in the training-data collection step 402. In the step 402, a manually selected classifier $C_{manual}$ can be used for decoding multiple codewords, such as N codewords, in an iteration i, wherein i is up to a maximum iteration number $i_{max}$. The BF decoder can determine which check-nodes are not satisfied by the current values of code-bits and flips some of these values based on the information of unsatisfied check-nodes. The BF decoder may also use other features to make the determination, by following the BF-rules, such as the mapping of the features and the flipping determination as shown in Table 2.

Before the iteration number reaches the maximum iteration number $i_{max}$, the features and genie-data for all code-bits of iterations within the range of $\{0, i\}$ can be stored for the N codewords in step 404. The features and the genie-data accumulated from the step 402 can be saved as training data ϕ and used for training classifier $C_{manual}$ in step 406. The trained classifier $C_{manual}$ can be returned in step 408 for future decoding procedure. When the iteration number reaches the maximum iteration number $i_{max}$, the classifier $C_{manual}$ is trained with the training data ϕ accumulated from the iterations within the range of $\{0, i_{max}-1\}$, the last trained classifier $C_{manual}$ can be returned as a final classifier $C_{manual}$ in step 408 for future decoding procedure.

Figure 5:
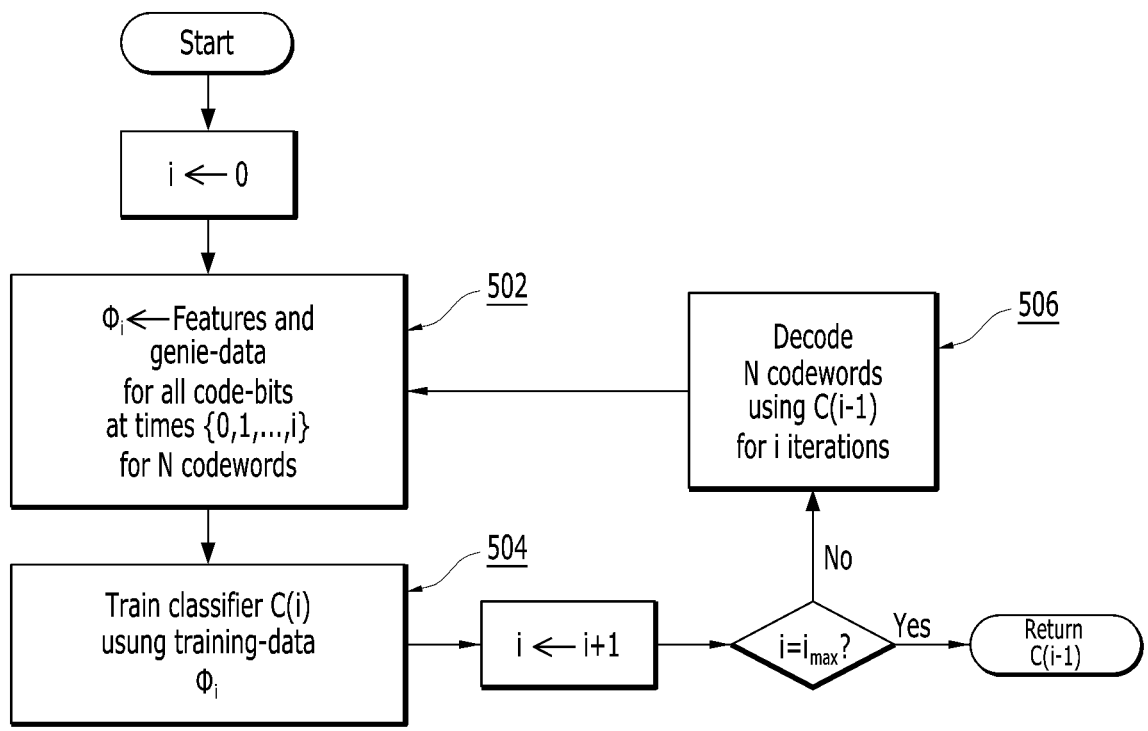
FIG. 5 is a flowchart illustrating flowchart illustrating a BF decoder using sequential-training of semiconductor memory devices 200 in accordance with an embodiment of the present invention.

Referring now to FIG. 5, herein is shown a flowchart illustrating a BF decoder using sequential-training of semiconductor memory devices 200 in accordance with an embodiment of the present invention. In the sequential-training framework, multiple classifiers can be trained sequentially in subsequence decoding iterations. The flowchart of methodology used in the sequential-training framework is shown in FIG. 5.

First, an initial training data $ϕ_i$ without any decoding-iterations, such as features and the genie data for all code-bits at initial iteration for N codewords can be generated in step 502, wherein the initial iteration number i=0. A classifier C(0) is trained with training-data $ϕ_0$ in step 504. Next, before the iteration number i reaches the maximum iteration number $i_{max}$, the BF decoder can decode N codewords using the classifier C(0) of the iteration 0 in step 506.

The predictions from the classifier C(0) can be used as the BF-rules for collecting training-data $ϕ_1$ for up to 1 decoding-iteration in the repeated step 502. Another classifier C(1) can be trained on the training-data $ϕ_1$ in the repeated step 504. Then predictions of C(1) can be created by decoding N codewords using C(1) for iteration i in the repeated step 506, wherein i=1. The predictions of C(1) can be used as the BF-rules for collecting training-data $ϕ_2$ for up to 2 decoding-iterations in the repeated step 502, and a classifier C(2) is trained on training-data $ϕ_2$ in the repeated step 504. This process can repeat sequentially till the training-data $ϕ_i$ for the maximum number of decoding iterations $i=i_{max}-1$ is collected and a classifier C(i) is train thereon. The predictions from the last classifier $C(i_{max}-1)$ can be used to define the BF-rules and returned for the BF decoder.

Figure 6:
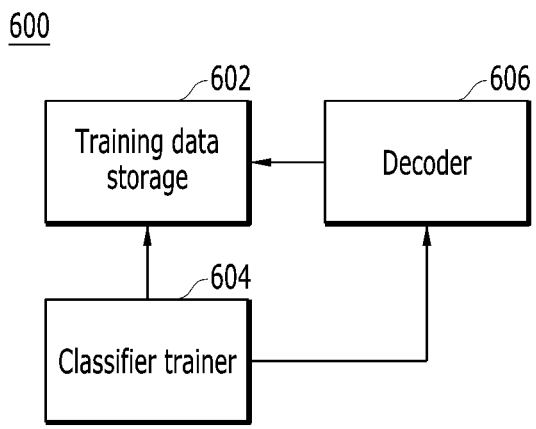
FIG. 6 is a diagram schematically illustrating various BF decoders of semiconductor memory devices 200 in accordance with an embodiment of the present invention.

Referring now to FIG. 6, herein is shown a diagram schematically illustrating various BF decoders of semiconductor memory devices 200 in accordance with an embodiment of the present invention. The BF decoders 600 may comprise a training data storage 602, a classifier trainer 604, and a decoder 606.

The training data storage 602 may collect initial training data to start the classifier training of the initial iteration without any prediction results from the decoder 606. In the subsequent iterations, the training data storage 602 may collect and store the training data including the features and genie-data for all code-bits for N codewords of all iterations. The collected training data can be used to train classifiers by the classifier trainer 604. The trained/updated classifiers including same classifiers in batch-training or additional/new classifiers in sequential training can be forwarded to the decoder 606. The decoder 606 for decoding the N codewords using the trained classifiers. The prediction results or decoding results can be feedback to the training data storage 602, along with the observed features and genie data, as the training data for the next iteration, until the iteration number reaches a maximum iteration number.

Figure 7:
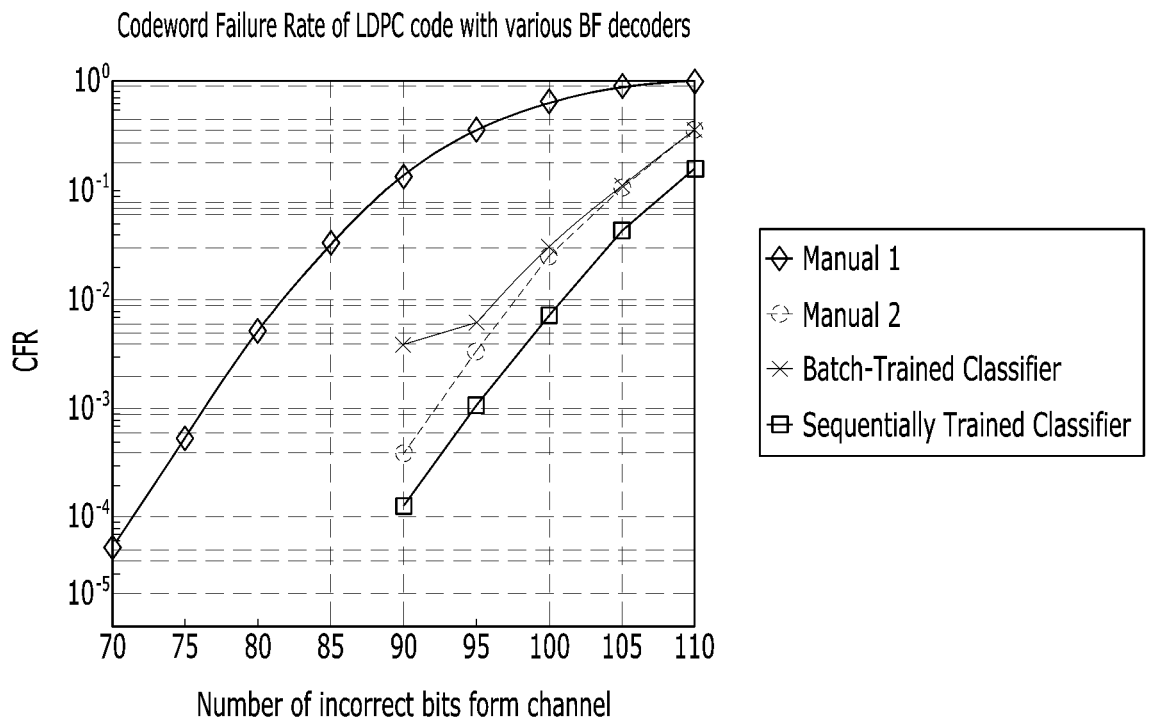
FIG. 7 is a diagram illustrating various BF decoders performance of semiconductor memory devices 200 in accordance with an embodiment of the present invention.

Referring now to FIG. 7, herein is shown a diagram illustrating various BF decoders performance of semiconductor memory devices 200 in accordance with an embodiment of the present invention. FIG. 7 shows the performance of the BF decoders trained by the two variations, such as batch-training BF decoder shown in FIG. 4 and sequential-training BF decoder shown in FIG. 5, along with two manually-optimized BF decoders. As shown in FIG. 7, the BF decoder using batch-training performs closely to the manually optimized BF decoder, and the BF decoder using sequentially-training can out-perform all other BF decoders including manually optimized BF decoders and the batch-training BF decoder.

The framework defined to determine optimized BF rules can first collect training-data, wherein the training data may consist of the genie data and features observed by decoders and using previously known BF rules during decoding, manually set or obtained from the last trained classifier. Then the framework can use the collected training data to train a new classifier to predict which code-bits are correct/incorrect based on the features observed by decoder. For each iteration, the classifier can be trained with the training date and features of the current iteration. The trained classifier of the currently iteration can be used for the decoding in a next iteration. The same classifier may be used in the batch-training BF decoder, while a different classifier may be used in the sequentially-training BF decoder. The decoding procedure can be repeatedly performed until a maximum iteration number is reached. The maximum iteration number can be predetermined and configured by the memory system. Alternatively, the maximum iteration number can be configured and adjusted by the memory system during the decoding procedure.

It has been discovered that a semiconductor memory system and an operating method thereof provided in the embodiments of the present invention, can internationally optimize classifiers by training the classifiers with collected training data and observed features, and perform error correction decoding according to certain BF rules set by the trained classifiers. Conducting error correction decoding according to the corresponding internationally optimized classifiers can optimize decoding results, reduce power consumption, and improve overall memory system performance.

Figure 8:
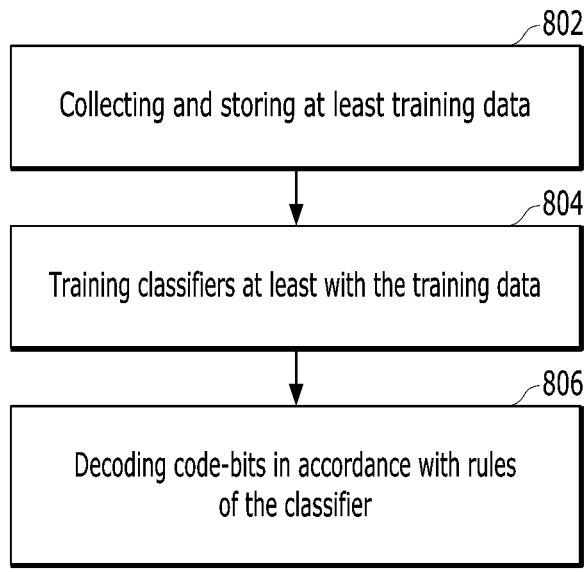
FIG. 8 is a flowchart illustrating an operating method of a semiconductor memory system in a further embodiment of the present invention.

Referring now to FIG. 8, herein is shown a flowchart illustrating an operating method of a semiconductor memory system in a further embodiment of the present invention. The flowchart of operating method of a semiconductor memory system comprising: performing decoding iterations, wherein the decoding iterations including collecting and storing at least training data in a block of 802, training classifiers at least with the training data in a block of 804, and decoding code-bits in accordance with rules of the classifier in a block of 806.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of a foregoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A memory system comprising:
   a memory device; and
   a controller coupled with the memory device, the controller including a training data storage configured to store training data, a decoder configured to perform multiple iterations of decoding, and a classifier trainer configured to train at least one classifier in the multiple iterations of decoding using the training data, wherein the at least one classifier is trained to make decoding predictions in a future decoding operation,
   wherein the training data storage, the decoder and the classifier trainer cooperate to collect the training data by decoding codewords using a set of bit-flipping decoding rules up to a maximum number of iterations to generate a single final classifier to make decoding predictions in the future decoding operation, which is performed in a non-training capacity, and
   wherein the single final classifier provides improved decoding performance in comparison to the set of bit-flipping decoding rules.

2. The memory system of claim 1, wherein:
   the controller collects initial training data comprising features of the decoder and genie-data, and
   the training data storage stores the initial training data.

3. The memory system of claim 2, wherein:
   the training data storage, the decoder and the classifier trainer cooperate to train an initial classifier using the initial training data.

4. The memory system of claim 3, wherein:
   the training data storage, the decoder and the classifier trainer cooperate to perform N stages of decoding to generate N classifiers respectively, up to a maximum number of decoding iterations, the N stages including a first stage in which the initial classifier is used as initial training data to train a first classifier, and in each of the second to Nth stages, the corresponding classifier is trained using the classifier trained in the immediately preceding stage.

5. The memory system of claim 1, wherein the training data includes features observed during decoding and genie-data containing information as to whether or not a code-bit is to be flipped.

6. The memory system of claim 5, wherein the features include iteration number, number of neighboring unsatisfied check nodes, degree of variable node, total number of unsatisfied check nodes, and whether current value matches channel output.

7. The memory system of claim 1, wherein the decoder is a bit-flipping decoder.

8. A method of operating a memory system including a decoder, the method comprising:
   collecting training data for training at least one classifier; and
   performing multiple iterations of decoding using the training data to train the at least one classifier, wherein the at least one classifier is trained to make decoding predictions in a future decoding operation,
   wherein the training data is collected by decoding codewords using a set of bit-flipping decoding rules up to a maximum number of iterations to generate a single final classifier to make decoding predictions in the future decoding operation, which is performed in a non-training capacity, and
   wherein the single final classifier provides improved decoding performance in comparison to the set of bit-flipping decoding rules.

9. The method of claim 8, wherein:

the collecting includes collecting initial training data comprising features of the decoder and genie-data.

10. The method of claim 9, further comprising:

training an initial classifier using the initial training data.

11. The method of claim 10, wherein:

the performing includes performing an iteration of the multiple iterations of decoding using the initial classifier as initial training data to train a first classifier.

12. The method of claim 11, wherein:

the performing further includes performing up to two iterations of the multiple iterations of decoding using the first classifier as first training data to train a second classifier.

13. The method of claim 12, wherein:

the performing further includes performing two or more iterations of the multiple iterations of decoding using the second classifier as second training data to train a third classifier.

14. The method of claim 10, wherein:

the performing includes performing N stages of decoding to generate N classifiers respectively, up to a maximum number of decoding iterations, the N stages including a first stage in which the initial classifier is used as initial training data to train a first classifier, and in each of the second to Nth stages, the corresponding classifier is trained using the classifier trained in the immediately preceding stage.

15. The method of claim 14, further comprising:

returning the Nth classifier for use in decoding in a non-training capacity.

16. The method of claim 8, wherein the training data includes features observed during decoding and genie-data containing information as to whether or not a code-bit is to be flipped.

17. The method of claim 16, wherein the features include iteration number, number of neighboring unsatisfied check nodes, degree of variable node, total number of unsatisfied check nodes, and whether current value matches channel output.

* * * * *